(12) United States Patent
Tsujimoto

(10) Patent No.: US 7,819,679 B2
(45) Date of Patent: Oct. 26, 2010

(54) CARD CONNECTOR

(75) Inventor: Masaki Tsujimoto, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 12/621,093

(22) Filed: Nov. 18, 2009

(65) Prior Publication Data
US 2010/0130041 A1 May 27, 2010

(30) Foreign Application Priority Data

Nov. 21, 2008 (JP) .............................. 2008-298724

(51) Int. Cl.
*H01R 13/62* (2006.01)
(52) U.S. Cl. ...................................................... 439/159
(58) Field of Classification Search ................. 493/159, 493/160
See application file for complete search history.

(56) References Cited

U.S. PATENT DOCUMENTS

| | | | | |
|---|---|---|---|---|
| 6,065,984 | A * | 5/2000 | Tung | 439/159 |
| 6,609,918 | B2 * | 8/2003 | Uchikawa | 439/159 |
| 7,008,245 | B1 * | 3/2006 | Chien | 439/159 |
| 2007/0243735 | A1 * | 10/2007 | Juang | 439/159 |

FOREIGN PATENT DOCUMENTS

| | | |
|---|---|---|
| JP | 10-289752 A | 10/1998 |
| JP | 11-054208 A | 2/1999 |
| JP | 11-086966 A | 3/1999 |
| JP | 2000-195587 A | 7/2000 |
| JP | 2003-077586 A | 3/2003 |
| JP | 2004-119266 A | 4/2004 |
| JP | 2004-207164 A | 7/2004 |
| JP | 2005-071667 A | 3/2005 |
| JP | 2006-179462 A | 7/2006 |
| JP | 2006-190564 A | 7/2006 |
| JP | 2006-196285 A | 7/2006 |

* cited by examiner

*Primary Examiner*—Tho D Ta
*Assistant Examiner*—Travis Chambers
(74) *Attorney, Agent, or Firm*—Rader, Fishman & Grauer PLLC

(57) ABSTRACT

A card connector includes a housing inserted a card therein, a slider, a rotating cam member having a shaft portion that is retained so as to be rotatable by the slider, and a compression coil spring that biases the rotating cam member. The slider includes second chevron teeth that engage with first chevron teeth provided at an end of the rotating cam member. The rotating cam member is provided with a first broad protrusion and a second narrow protrusion alternately at an outer circumference of the shaft portion. When inserting the card, since the rotating cam member turns by a predetermined angle so that the first protrusion faces the starting end of the passage groove, the slider is locked. When pushing the card again, since the rotating cam member turns by a predetermined angle, the second protrusion faces the starting end of the passage groove, the card can be ejected.

2 Claims, 18 Drawing Sheets

CARD CONNECTOR

This application is based on and claims the benefit of priority from Japanese Patent Applications No. 2008-298724, filed on 21 Nov. 2008, the content of which is incorporated herein by reference.

BACKGROUND OF THE INVENTION

1. Field of the Invention

The present invention relates to a card connector. More specifically, the present invention relates to a card connector with an eject mechanism that facilitates ejection of a card.

2. Related Art

In a so-called push-push type card connector with eject mechanism, when a card is inserted (pushed) into a connector, the card is locked. When the card is pushed again, the lock is released and the card is ejected from the connector. In the push-push type card connector, the eject mechanism disposed inside facilitates ejection of the card by way of a pressing operation of the card.

As the above-mentioned push-push type eject mechanism, an eject mechanism has been known which includes a slider that forms a heart-shaped cam groove and a guide rod that is guided to the heart-shaped cam groove, as disclosed in Japanese Laid-Open Application Publication No. 2005-071667.

In the connector with the eject mechanism shown in Japanese Laid-Open Application Publication No. 2005-071667, one end of the guide rod moves along the heart-shaped cam groove by way of the pressing operation of the card to define an engaging position of an ejecting position of the card. However, the connector disclosed in Japanese Laid-Open Application Publication No. 2005-071667 has a defect in which an external form of the connector is large since a broad slider is provided inside the housing.

In order to overcome the above-mentioned defect, for example, Japanese Laid-Open Application Publication No. 2000-195587 discloses a small card connector in which an engaging and ejecting mechanism of a card is made smaller.

The card connector disclosed in Japanese Laid-Open Application Publication No. 2000-195587 is provided with a housing of plate shape and a tray. The housing has a plurality of contacts disposed at a concave portion. The tray can be slid against the concave portion and receive the card.

When the tray receives the card at a front position and moves toward a back position, the tray is engaged with the housing so as to remain at the back position. Then, when the tray is pressed backward again, it is configured so that the engagement is released and the tray is returned back to the front position again.

The card connector disclosed in Japanese Laid-Open Application Publication No. 2000-195587 includes cavities (a first cavity and a second cavity which communicate with each other) that are formed in a board thickness direction (a thickness direction of the housing in a configuration of the housing). In this way, it is necessary for the card connector disclosed in Japanese Laid-Open Application Publication No. 2000-195587 to include at least a pair of molds facing each other in a depth direction of the housing and a pair of molds facing each other in a thickness direction of the housing. Thus, this results in one of the causes for which manufacturing cost of the housing cannot be reduced. Moreover, the card connector disclosed in Japanese Laid-Open Application Publication No. 2000-195587 has a configuration which is not assembled easily since components thereof are not molded easily.

SUMMARY OF THE INVENTION

The present invention addresses such a problem and has an object of to provide a card connector for which components are easily molded and which is easily assembled.

A card connector according to a first aspect of the present invention includes: a housing of a flat plate shape that is provided with a concave portion into which a card is inserted; a cover that is provided with a flat surface, covering the concave portion of the housing; a slider of a trough shape that is disposed at one wing of the concave portion of the housing and is allowed to move only back and forth substantially in parallel with an insertion direction of the card; a rotating cam member that is rotatable while being retained in the slider and slightly moving in an axial direction; and a biasing means for biasing the rotating cam member in a direction that the card is ejected with a force, in which the housing includes a first linear groove and a second linear groove that guide a first projection and a second projection that are disposed so as to face each other along a longitudinal direction of the slider, the slider includes a tab piece that protrudes in a direction substantially perpendicular to the longitudinal direction of the slider and can be abutted by an end edge of the card, the rotating cam member includes: a plurality of protrusions that protrudes radially to an outer circumference of a cylindrical shaft portion, and have first broad protrusions and second narrow protrusions alternately; a plurality of ratchet shaped first chevron teeth that is provided at one end of the shaft portion and protrudes in an axial direction; and an edge face that is provided at the other end of the shaft portion and is abutted by one end of the biasing means, the housing includes: a minor arc groove that receives an outer circumference of the shaft portion; a passage groove that communicates with the first linear groove that guides the first projection so that only one of the second protrusion can pass therethrough; and a pair of first inclined surfaces that is formed in both sides of a starting edge of the passage groove at predetermined angles so that a plane including a central axis of the rotating cam member intersects a plane of each of the first inclined surfaces at the same angle, and the slider includes: a bearing portion that is open in an outer circumferential direction and retains an outer circumference of the shaft portion; and a plurality of ratchet shaped second chevron teeth that engages with the first chevron teeth so as to rotate the rotating cam member intermittently in a single direction, the first protrusion and the second protrusion have, in a direction in which the first chevron teeth protrude, a second inclined surface that abuts a pair of the first inclined surfaces so as to rotate the rotating cam member intermittently in a single direction, and the housing is mainly formed with a pair of molds facing both surfaces thereof.

Here, it is preferable for the housing to have an insulation property. A housing with an insulation property here may refer to a housing made of a non-conductive material, and a housing of a desired shape with an insulation property can be obtained by molding a synthetic resin.

For example, a housing may include a pair of arms that extends in parallel from a base end portion toward a leading end portion and a connecting portion that connects the base end portions of the pair of the arms. Grooves that face each other and range from the leading end portions to the base end portions may be provided in the pair of the arms. Then, both sides of the card may be guided along these grooves so as to accommodate the card in the housing.

By way of press fit or molding (integrally molding) of a base end portion of the housing, a plurality of contacts may be secured. A terminal of the contacts may be in contact with a terminal of a card (an electric terminal). It is preferable for the other terminal of the contacts to be joined by way of solder with a printed board. The other terminal of the contacts may be joined solderlessly with the printed board.

The contact may be a pin contact, a socket contact, or a plate shaped contact with elasticity such as a cantilever contact. A suitable contact can be selected so as to correspond to types of terminals provided at a card.

A card connector according to a second aspect of the present invention includes: a housing of a flat plate shape that is provided with a concave portion into which a card is inserted; a cover that is provided with a flat surface, covering the concave portion of the housing; a slider of a trough-shape that is disposed at one wing of the concave portion of the housing and is allowed to move only back and forth substantially in parallel with an insertion direction of the card; a rotating cam member that is rotatable while being retained in the slider and slightly moving in an axial direction; and a biasing means for biasing the rotating cam member in a direction that the card is ejected with a force, in which the housing includes a linear groove that guides projections disposed along a longitudinal direction of the slider, the slider includes a tab piece that protrudes in a direction substantially perpendicular to the longitudinal direction of the slider and can be abutted by an end edge of the card, the rotating cam member includes: a pair of protrusions that protrudes in an opposite direction than to an outer circumference of a shaft portion of cylindrical shape; a plurality of ratchet shaped first chevron teeth that is provided at one end of the shaft portion and protrudes in an axial direction; and an edge face that is provided at the other end of the shaft portion and is abutted by one end of the biasing means the housing includes: a minor arc groove that receives an outer circumference of the shaft portion; an arc groove that shares a central axis with the minor arc groove so that only an outer circumference of the shaft portion excluding the pair of protrusions can pass therethrough; a pair of first inclined surfaces that is formed in both sides of a starting end of the arc groove at predetermined angles so that a plane including the central axis intersects a plane of each of the first inclined surfaces at the same angle, and the slider includes: a bearing portion that is open in an outer circumferential direction and retains an outer circumference of the shaft portion; and a plurality of ratchet shaped second chevron teeth that engages with the first chevron teeth so as to rotate the rotating cam member intermittently in a single direction, the protrusion has, in a direction that the first chevron teeth protrudes, a second inclined surface that abuts a pair of the first inclined surfaces so as to rotate the rotating cam member intermittently in a single direction, and the housing is mainly formed with a pair of molds facing both surfaces thereof.

The card connector according to the present invention realizes a push-push type card connector since the card connector is locked when the card is pushed into the connector, and then released and ejected from the connector when the card is pushed again.

Furthermore, in relation to the housing configuration, the card connector according to the present invention is not provided with a cavity which is formed from a broad thickness direction such as the housing in Japanese Laid-Open Application Publication No. 2000-195587. The housing according to the present invention is mainly formed by a pair of molds facing both surfaces thereof. Accordingly, this can contribute to a reduction in manufacturing of the housing.

Furthermore, the card connector according to the present invention can assemble the housing, the rotating cam member, and the slider so as to be stacked, and thus can provide a card connector having easy assembly.

DETAILED DESCRIPTION OF THE INVENTION

The inventor has devised a connector having a card engagement and ejection mechanism and for which component formation is easy, and a novel card connector having a card engagement and ejection mechanism and for which assembly is easy, by way of an arrangement in which a rotating cam member is internally attached to a slider that is engaged with a leading end edge of the card and can move back and forth. A description thereof is provided below.

Figure 1:
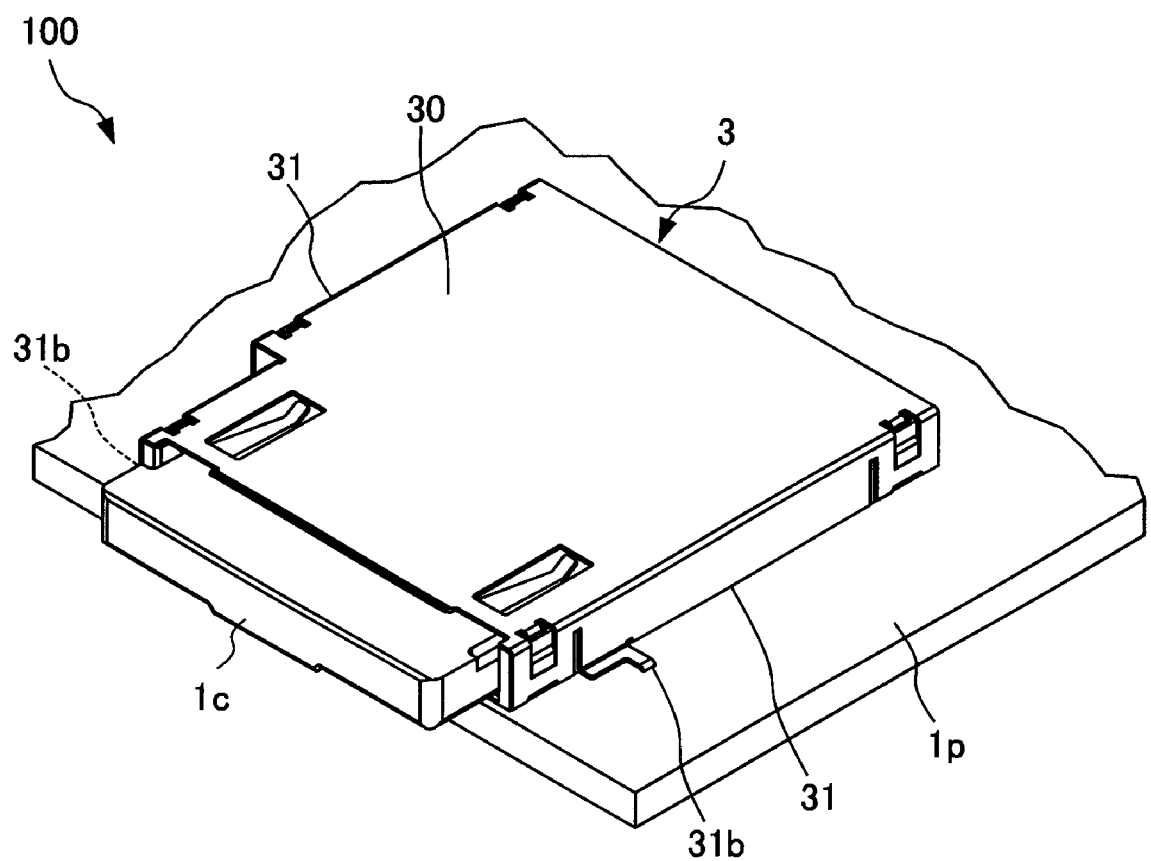
FIG. 1 is a perspective view showing a first embodiment of a card connector according to the present invention.
Figure 2:
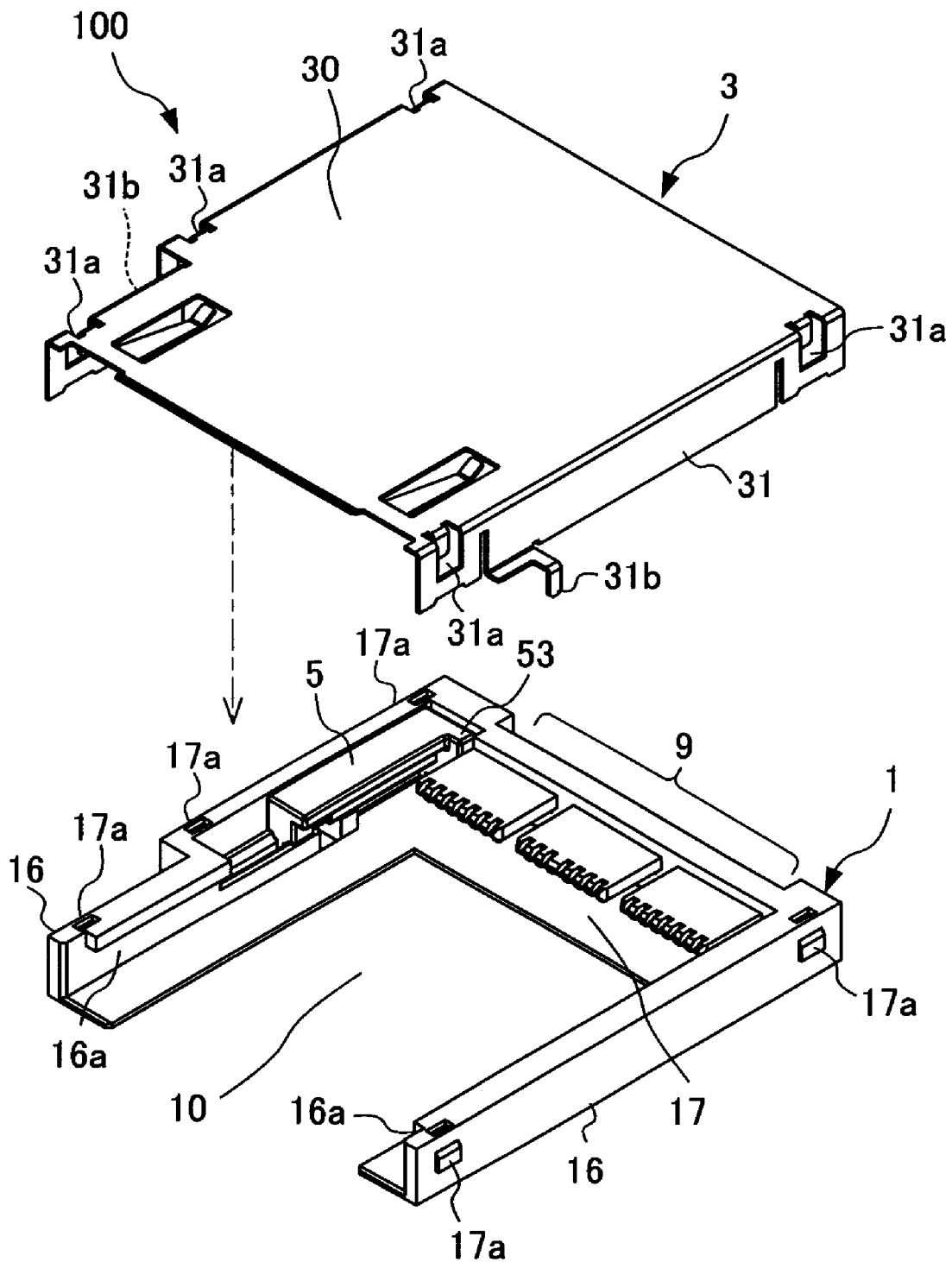
FIG. 2 is a first perspective exploded view of a card connector according to the first embodiment.

FIG. 1 is a perspective view illustrating a first embodiment of a card connector (hereinafter abbreviated as a connector) according to the present invention, and illustrates a state in which a card is mounted. FIG. 2 is a first perspective exploded view of a connector according to the first embodiment and illustrates a state in which a cover is separated.

Figure 3:
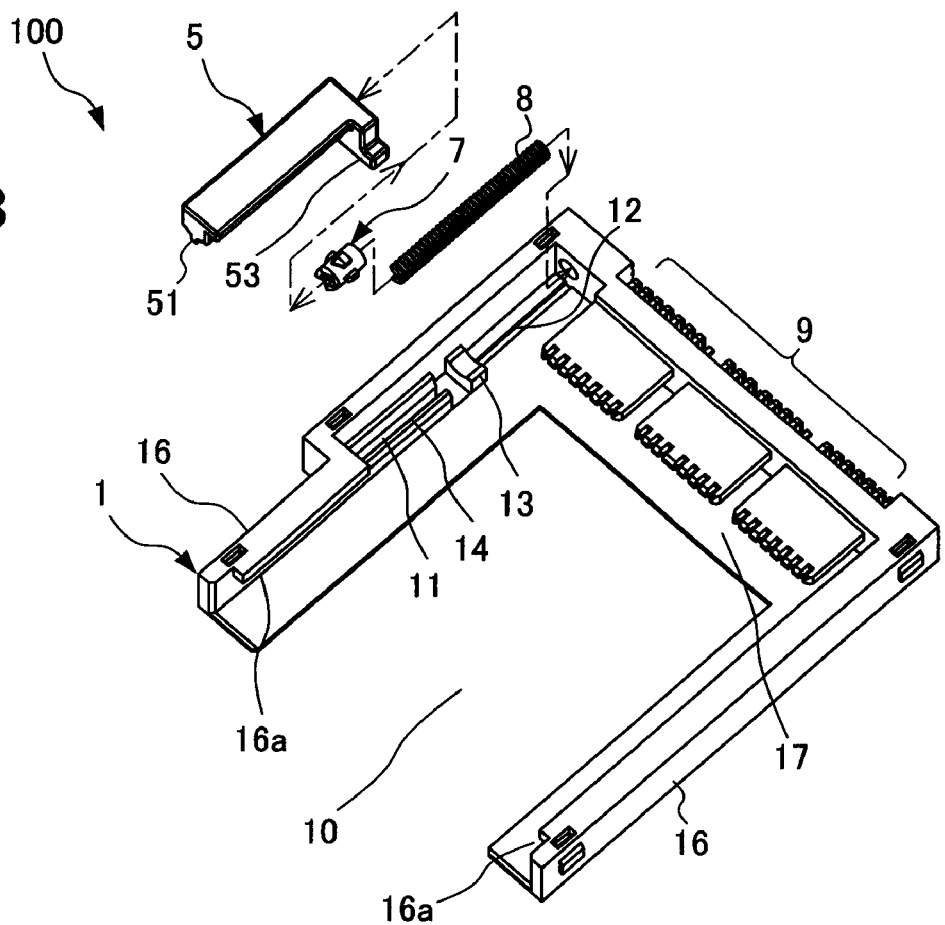
FIG. 3 is a second perspective exploded view of a card connector according to the first embodiment.
Figure 4:
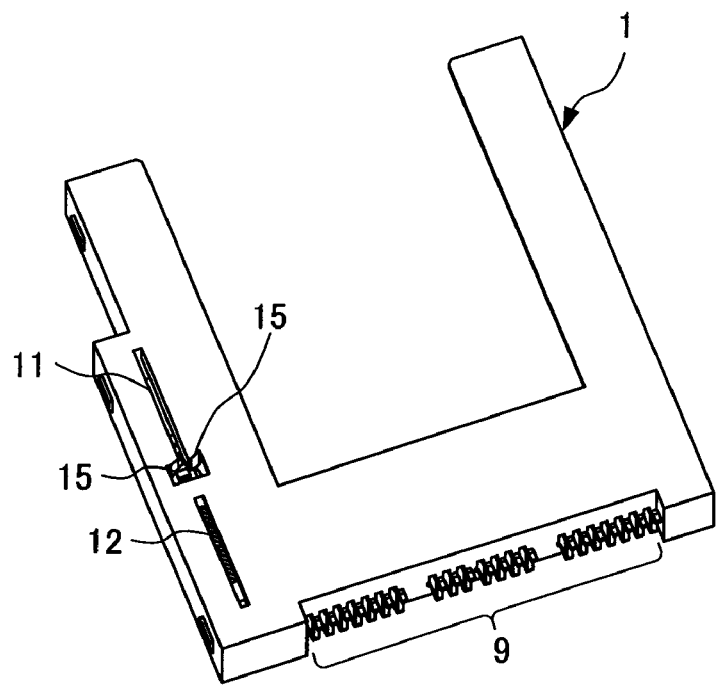
FIG. 4 is a third perspective exploded view of a card connector according to the first embodiment.
Figure 5:
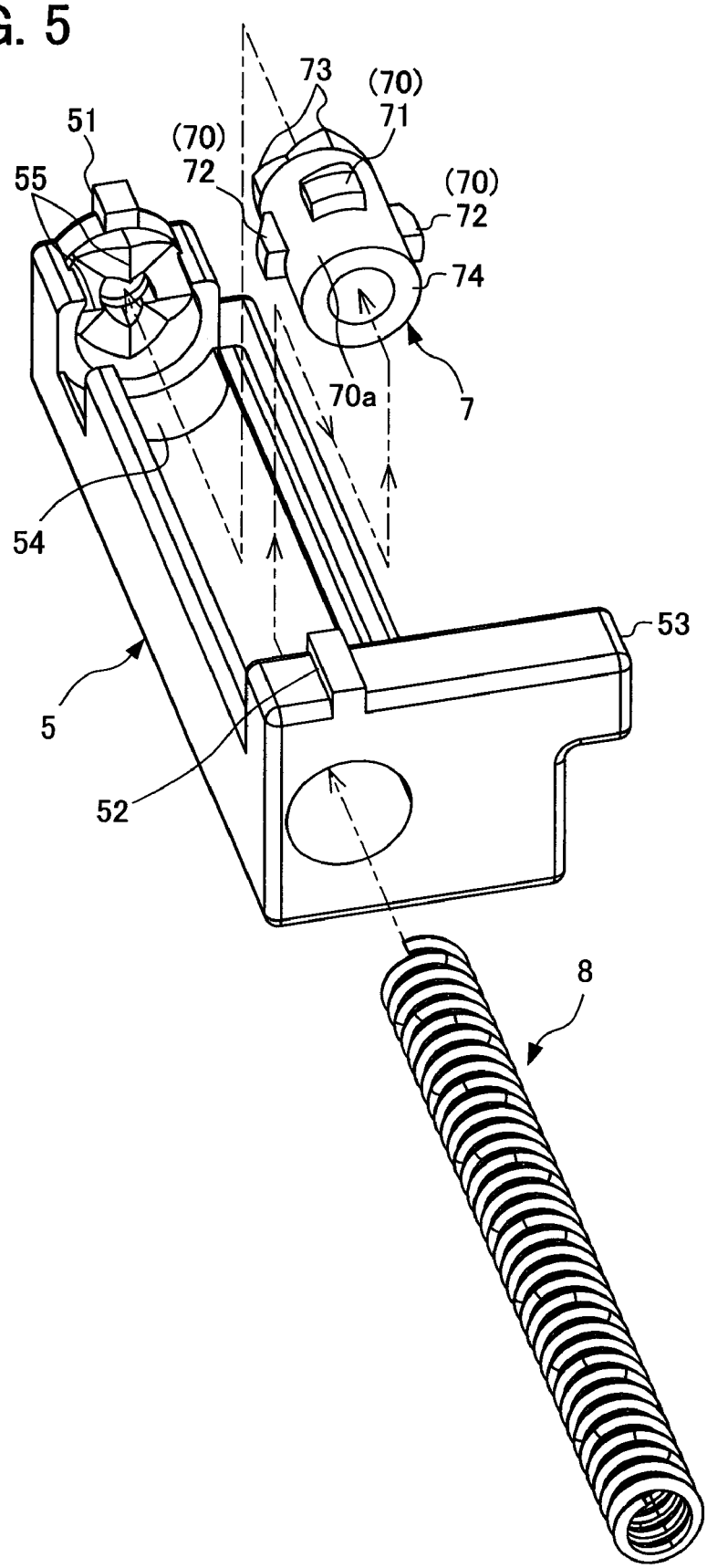
FIG. 5 is a fourth perspective exploded view of a card connector according to the first embodiment.

FIG. 3 is a second perspective exploded view of a connector according to the first embodiment and illustrates a state in which a cover is removed. FIG. 4 is a third perspective exploded view of a connector according to the first embodiment and illustrates a connector according to the first embodiment as seen from a lower face. FIG. 5 is a fourth perspective exploded view of a connector according to the first embodiment, and is configured with a slider, a rotating cam member, and a compression coil spring.

First, a configuration of a connector according to the first embodiment of the present invention is explained. With reference to FIGS. 1 to 5, a connector 100 according to the first embodiment includes a housing 1 of a flat plate shape, a cover 3, and a slider 5 of a trough shape. The housing 1 is provided with a concave portion to which a card 1c is inserted. The cover 3 is provided with a flat surface 30 that covers the concave portion 10 of the housing 1. The slider 5 is disposed at one side of the concave portion 10 of the housing 1. In addition, the slider 5 is allowed to move only back and forth substantially parallel to an insertion direction.

Furthermore, with reference to FIGS. 1 to 5, the connector 100 is provided with a rotating cam member 7 and a compressing coil spring (a biasing means) 8. The rotating cam member 7 is rotatable while being retained in the slider 5 and slightly moving in an axial direction. The compressing coil spring 8 biases the rotating cam member 7 in a direction in which the card 1c is ejected.

With reference to FIGS. 1 to 5, the housing 1 includes a first linear groove 11 and a second linear groove 12. The first linear groove 11 and the second linear groove 12 guide a first projection 51 and a second projection 52 which are disposed to face each other along a longitudinal direction of the slider 5.

With reference to FIGS. 1 to 5, the slider 5 includes a tab piece 53. The tab piece 53 protrudes in a direction substantially orthogonal to a longitudinal direction of the slider 5, and an end edge of the card 1c can abut thereto.

With reference to FIG. 3 or 5, the rotating cam member 7 includes a plurality of protrusions 70, a plurality of ratchet shaped first chevron teeth 73, and an edge face 74. The plurality of protrusions 70 protrude radially to an outer circumference of a cylindrical shaft portion 70a. Then, as the plurality of protrusions 70, first broad protrusions 71 and second narrow protrusions 72 are provided in an alternately. The first chevron teeth 73 are provided at one end of the shaft portion 70a and protrude in an axial direction. The end face 74 is provided at the other end of the shaft portion 70a and one end of the compressing coil spring 8 abuts the edge face 74.

With reference to FIGS. 2 to 5 again, the housing 1 is provided with a minor arc groove 13, a passage groove 14, and a pair of inclined surfaces 15 and 15. The minor arc groove 13 receives an outer circumference of the shaft portion 70a. The passage groove 14 communicates with the first linear groove 11 that guides the first projection 51 so that only one second protrusion 72 can pass therethrough. The pair of the first inclined surfaces 15 and 15 is formed in both sides of a starting end of the passage groove 14 at a predetermined angle so that a plane including the rotational axis of the rotating cam member 7 intersects a plane of each of the first inclined surfaces 15 at the same angle.

With reference to FIG. 5 again, the slider 5 is provided with a bearing portion 54 and a plurality of ratchet shaped second chevron teeth 55. The bearing portion 54 is open in a direction of an outer circumference and retains an outer circumference of the shaft portion 70a. The second chevron teeth 55 engage with the first chevron teeth 73 so as to intermittently rotate the rotating cam member 7 in a single direction.

Figure 6:
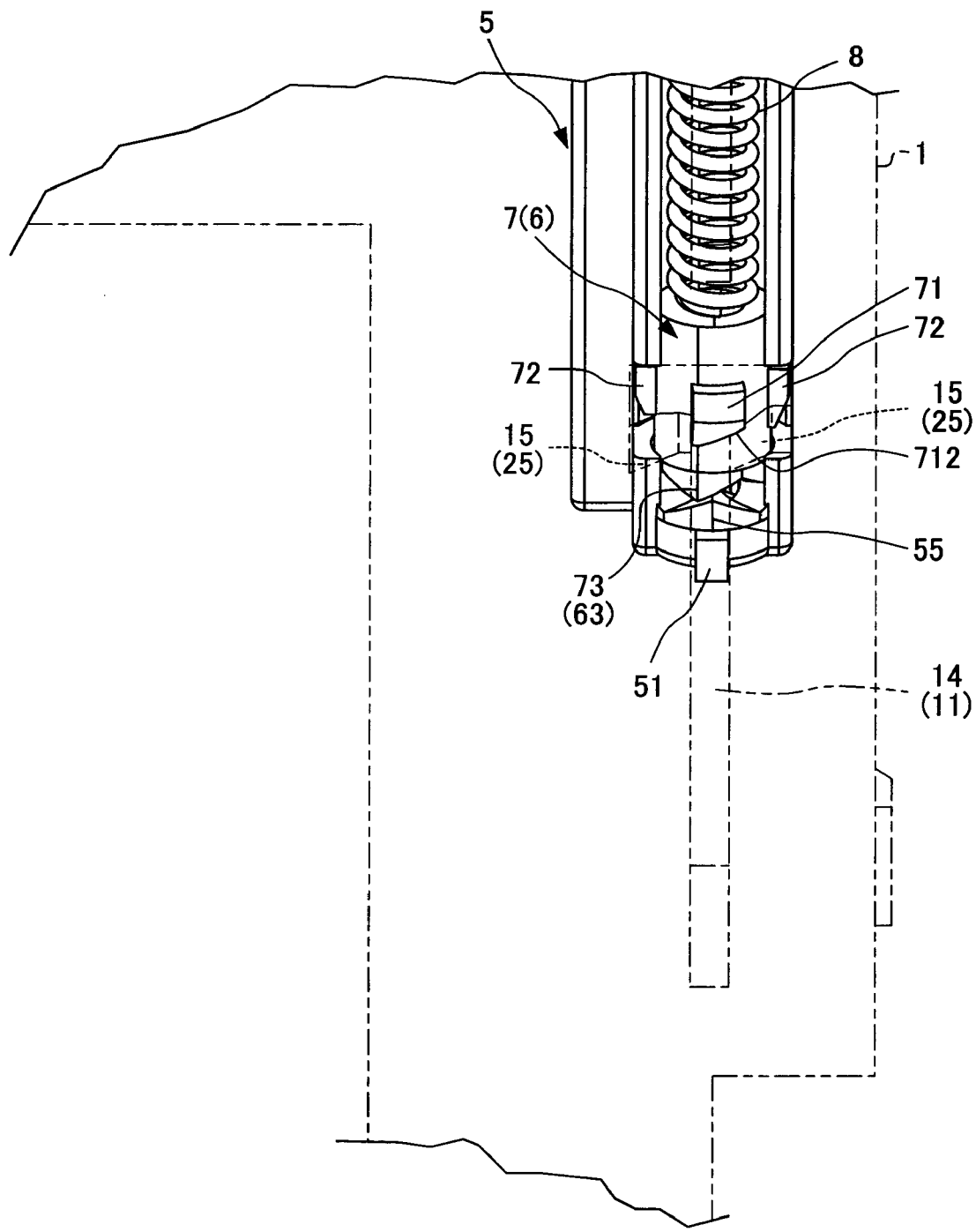
FIG. 6 is a first perspective view of a card connector according to the first embodiment as seen from a lower face.
Figure 9:
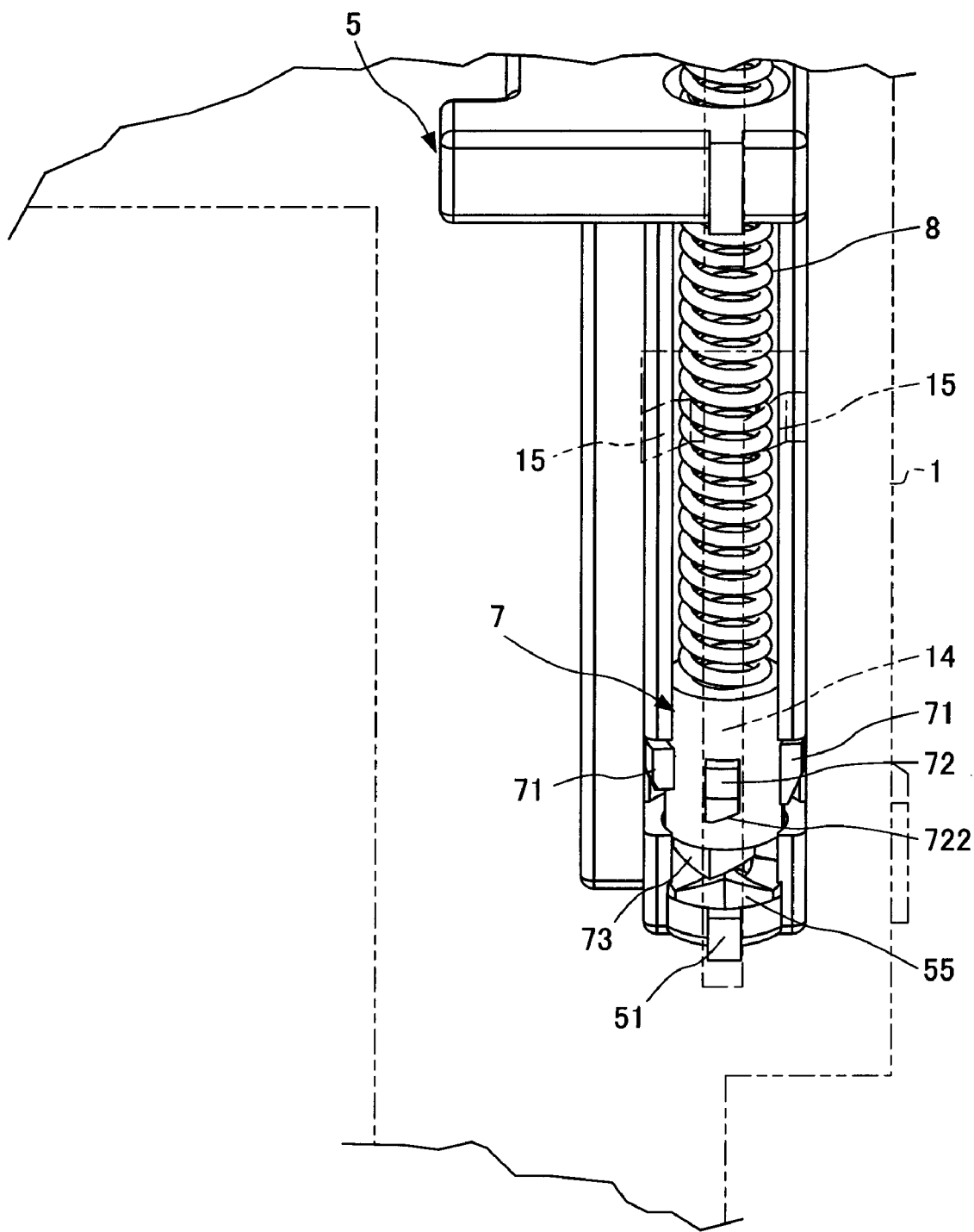
FIG. 9 is a fourth perspective view of a card connector according to the first embodiment as seen from a lower face.

With reference to FIG. 4 or 5, the first protrusion 71 and the second protrusion 72 are provided with inclined surfaces 712 and 722, respectively, in a direction in which the first chevron teeth 73 protrude (see FIG. 6 or 9). The second inclined surfaces 712 and 722 abut the pair of the first inclined surfaces 15 and 15 so as to intermittently rotate the rotating cam member 7 in a single direction.

With reference to FIG. 2 or 3, the housing 1 includes a pair of arms 16 and 16 extending in parallel from a base end portion to a leading end portion and a connecting portion 17 that connects the base end portions of the pair of the arms 16 and 16.

With reference to FIG. 2 or 3 again, the pair of the arms 16 and 16 are provided with a pair of grooves 16a and 16a facing each other and ranging from the leading end portion to the base end portion. Both sides of the card 1c are guided to the pair of the grooves 16a and 16a, and thus the card 1c can be accommodated in the housing 1 (see FIG. 1).

With reference to FIG. 2 or 3, a plurality of contacts 9 is fixed at the base end portion of the housing 1. An edge of these contacts 9 may be in contact with a terminal of the card (not shown) and the other edge of the contact portions 9 are joined by way of solder with a printed board 1p (see FIG. 1).

With reference to FIG. 1 or 2, the cover 3 is composed of sheet metal and an expanded metal sheet is formed. The cover 3 is composed of sheet metal having conductivity, and a shielding effect can be obtained by a flat surface 30 of the cover 3 covering the housing 1. In addition, uplift of the slider 5 can be prevented by the flat surface 30 of the cover 3 covering the housing 1.

With reference to FIG. 1 or 2, in the cover 3, a pair of both wing pieces 31 and 31 are formed by folding both wings thereof to a substantially right angle. Then, a plurality of openings 31a are formed in the pair of both wing pieces 31 and 31 so as to be engaged with projections 17a protruding from the both side surfaces of the housing 1. Furthermore, both wing pieces 31 and 31 of the cover 3 are provided with a plurality of lead terminals soldered to the printed board 1p so that the connector 100 can be surface mounted to the printed board 1p.

Figure 7:
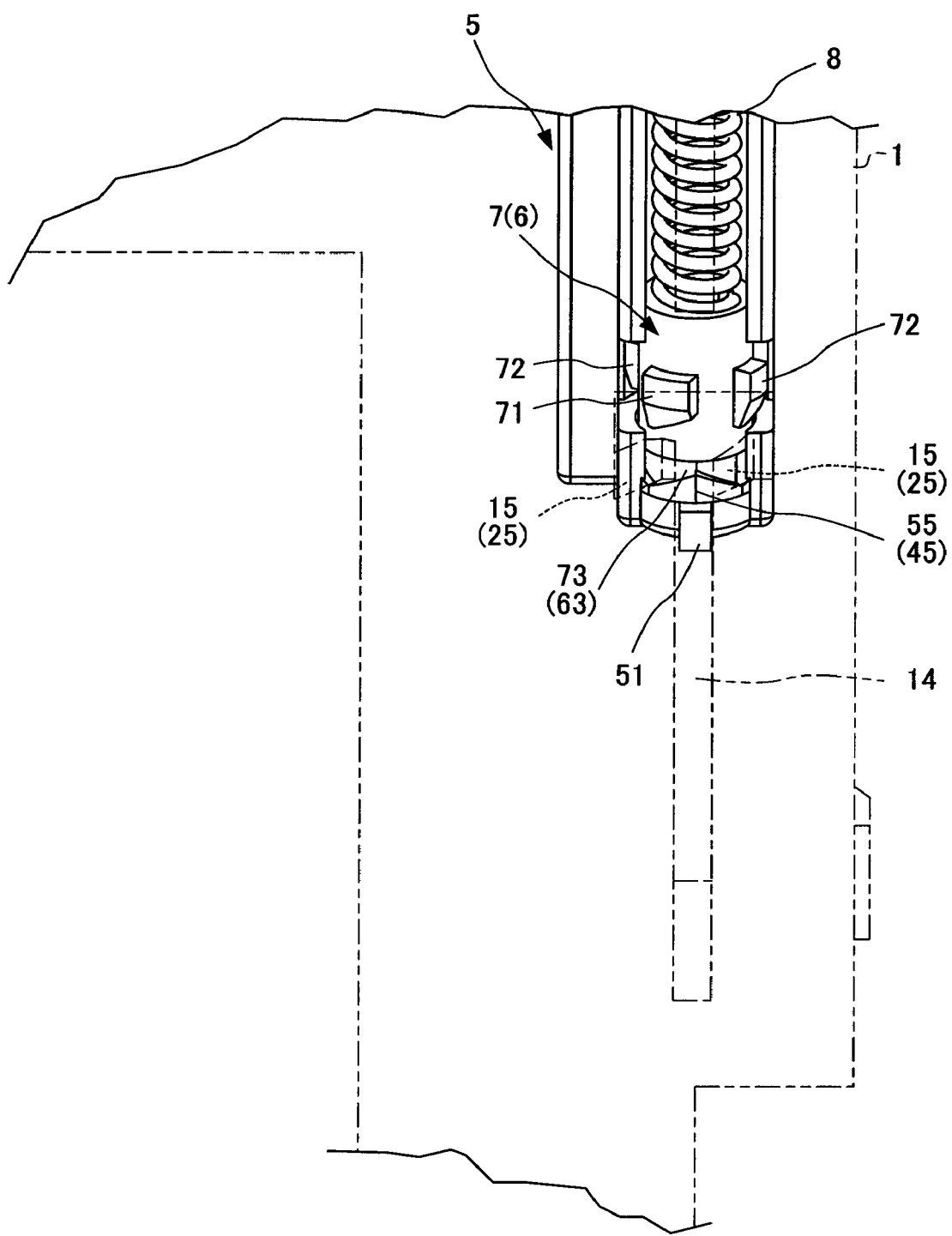
FIG. 7 is a second perspective view of a card connector according to the first embodiment as seen from a lower face.
Figure 8:
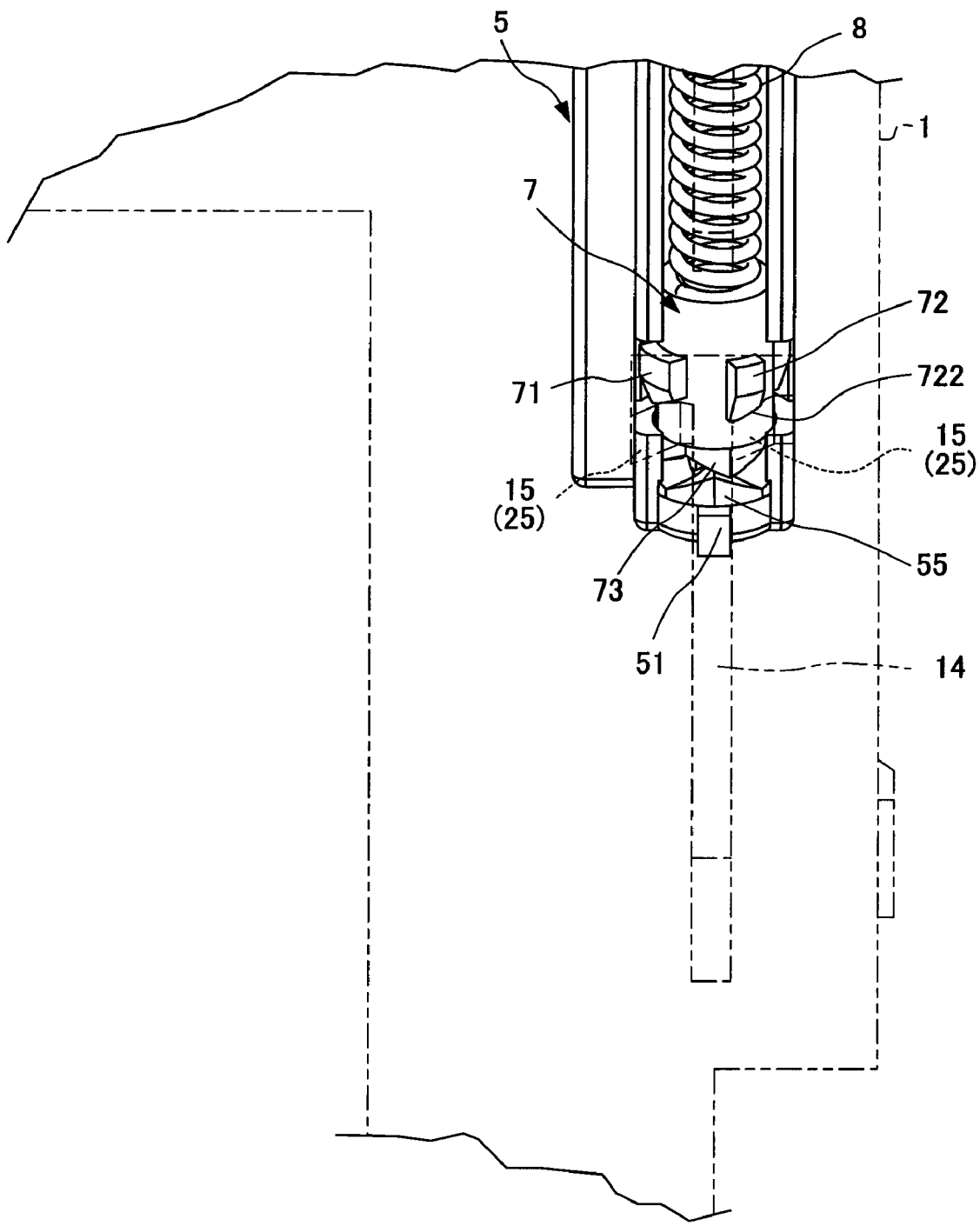
FIG. 8 is a third perspective view of a card connector according to the first embodiment as seen from a lower face.

FIG. 6 is a perspective view of a connector according to the first embodiment as seen from a lower face and shows a state in which the first rotating cam member is locked with the first housing. FIG. 7 is a perspective view of a connector according to the first embodiment as seen from a lower face and illustrates a state change of FIG. 6. FIG. 8 is a second perspective view of a connector according to the first embodiment as seen from a lower face and illustrates a state change from FIG. 8. FIG. 9 is a third perspective view of a connector according to the first embodiment as seen from a lower face and illustrates a standby state in which a card is not inserted.

Figure 10A:
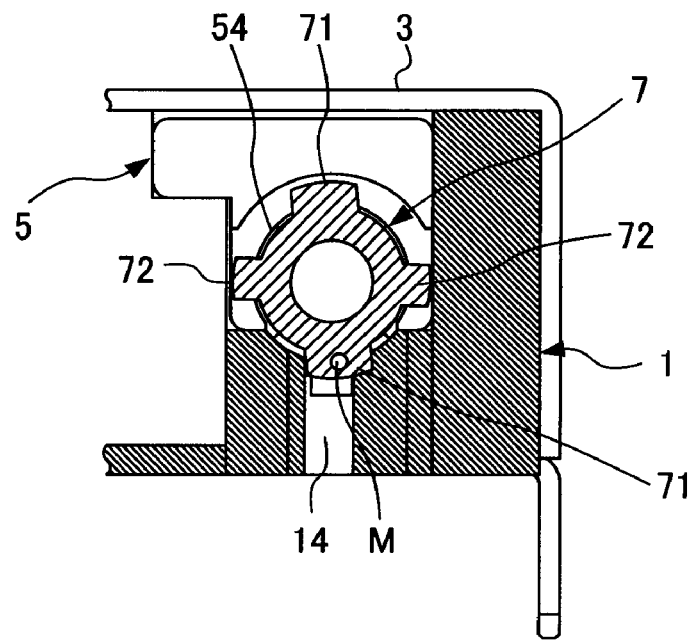
FIG. 10A is a cross-sectional view of FIG. 6.
Figure 10B:
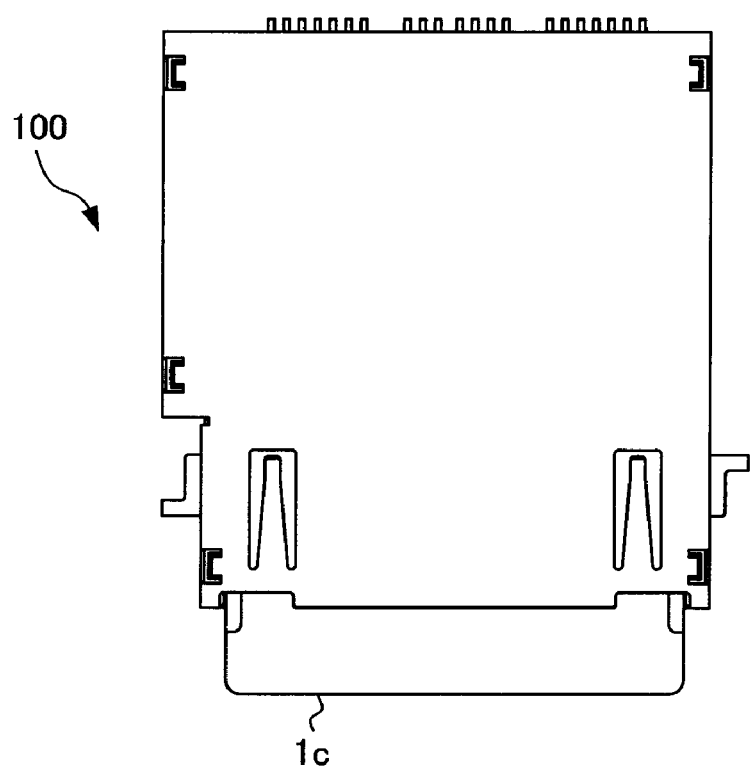
FIG. 10B is a plan view illustrating a state of a card connector when in the state of FIG. 10A.
Figure 11A:
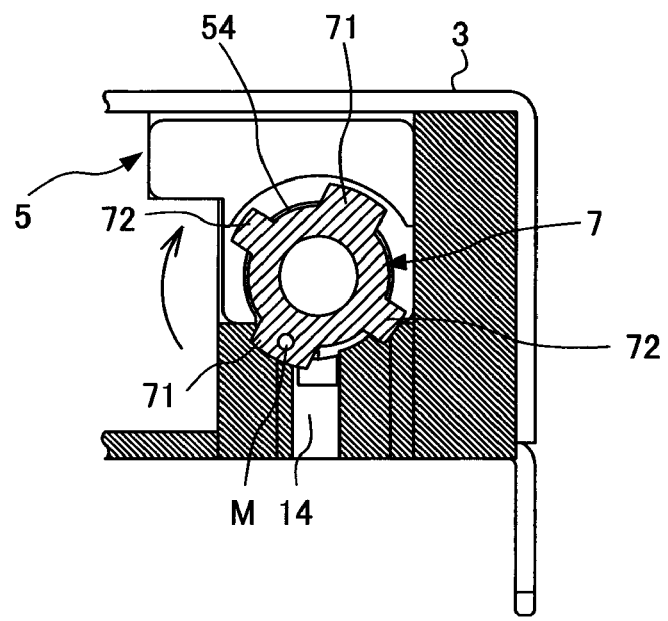
FIG. 11A is a cross-sectional view of FIG. 7.
Figure 11B:
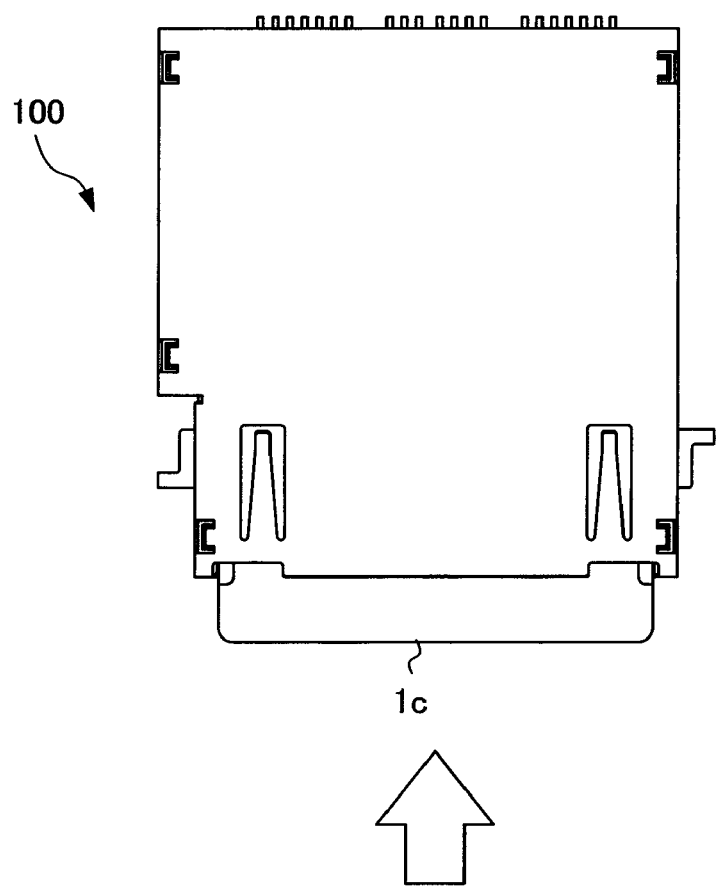
FIG. 11B is a plan view illustrating a state of a card connector when in the state of FIG. 11A.
Figure 12A:
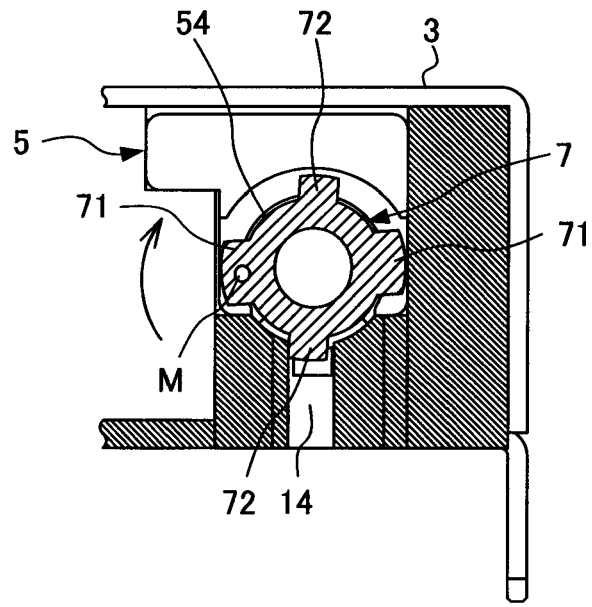
FIG. 12A is a cross-sectional view of FIG. 9.
Figure 12B:
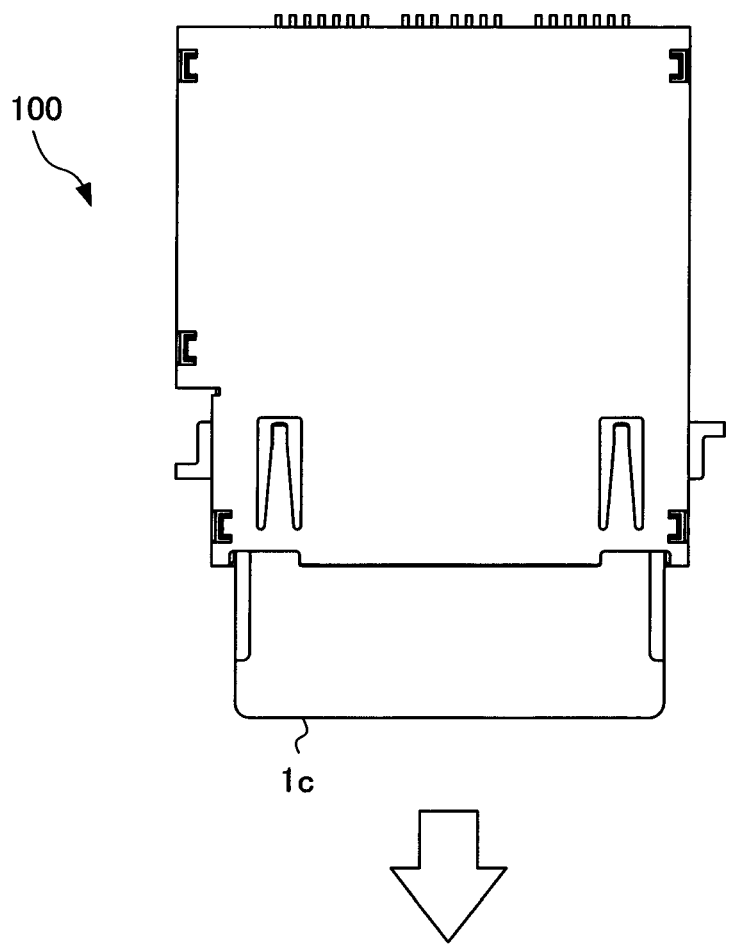
FIG. 12B is a plan view illustrating a state of a card connector when in the state of FIG. 12A.

FIGS. 10A and 10B are views illustrating a state in which a card is inserted to a connector according to the first embodiment. FIG. 10A is a cross-sectional view of a main section of FIG. 6 and FIG. 10B is a plan view illustrating a state of a card connector when in the state of FIG. 10A. FIGS. 11A and 11B illustrate a state change from FIG. 10. FIG. 11A is a cross-sectional view of a main section of FIG. 11A and FIG. 11B is a plan view illustrating a state of a card connector in a state shown in FIG. 11A. FIGS. 12A and 12B illustrate a state change from FIG. 11. FIG. 12A is a cross-sectional view of a main section of FIG. 9 and FIG. 12B is a plan view illustrating a state of a card connector when in the state of FIG. 12A.

Figure 13A:
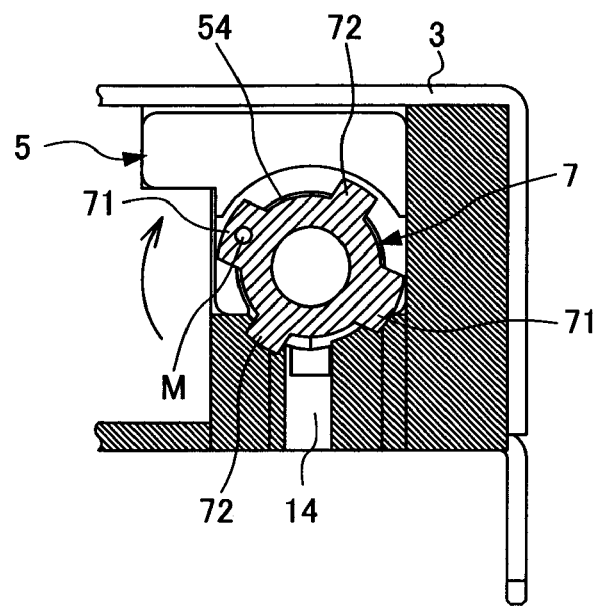
FIG. 13A is a view of a state change of FIG. 12A.
Figure 13B:
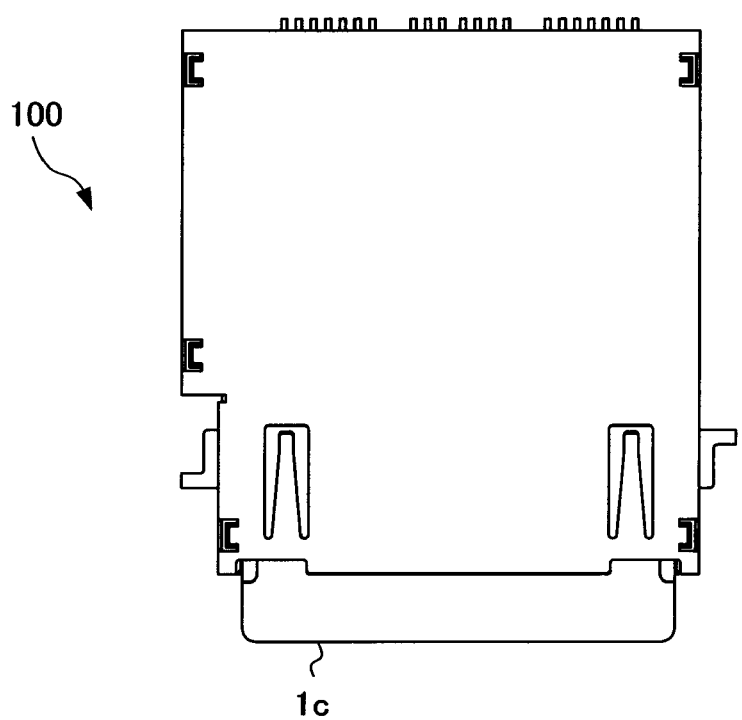
FIG. 13B is a plan view illustrating a state of a card connector when in the state of FIG. 13A.
Figure 13B:
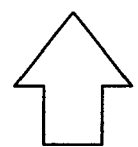

FIGS. 13A and 13B are views illustrating a state in which a card is inserted and pushed completely into a connector according to the first embodiment. FIG. 13A is a view illustrating a state change from FIG. 12A and FIG. 13B is a plan view illustrating a state of a card connector in the state of FIG. 13A.

With reference to FIGS. 10A and 10B through FIGS. 13A and 13B, actions and operations of a connector 100 according to a first embodiment of the present invention will be explained.

With reference to FIG. 3 or 5, the bearing portion 54 is open in a direction of an outer circumference to be slightly larger than the diameter of the shaft portion 70a. The shaft portion 70a can be retained by inserting the shaft portion 70a into the bearing portion 54 from a direction of the outer circumference. The minor arc groove 13 is open to be smaller than the diameter of the shaft portion 70a and can partially support an outer circumference of the shaft portion 70a.

In FIGS. 2 to 5, the slider 5 and the rotating cam member 7 configure an intermittent moving device. The bearing portion 54 and a plurality of the second chevron teeth 55 are disposed so as to face each other, sharing the central axis. Therefore, as the first chevron teeth 73 move back and forth in relation to the second chevron teeth 55, the rotating cam member 7 can be rotated intermittently in a single direction. Furthermore, the slider 5 and the rotating cam member 7 configure a three-dimensional cam device in which the rotating cam member 7 rotates while moving back and forth.

With reference to FIGS. 6, 10A and 10B, the card 1c enters a state of being inserted into the connector 100. The first chevron teeth 73 are imparted a force toward the second chevron teeth 55 by being biased by the compression coil spring 8. In the state shown in FIG. 6, although the first chevron teeth 73 are slightly engaged with the second chevron teeth 55, rotation of the rotating cam member 7 is stopped.

With reference to FIGS. 10A and 10B, by being biased by the compression coil spring 8, the rotating cam member 7 is imparted with a force to move toward a side of the leading end portion of the housing 1. However, since the first broad protrusion 71 faces the starting end of the passage groove 14, it is difficult to move the rotating cam member 7. That is, the slider 5 is locked in regard to the housing 1 (in a locked state).

It should be noted that round-shaped marks M shown in FIGS. 10A and 10B to 14 are represented for the sake of convenience of explanation of a rotational direction and a rotational order of the rotating cam member 7, and are not provided physically.

With reference to FIGS. 7, 11A and 11B, subsequent to the locked state, as the card 1c is pushed completely into a side of the base end portion of the concave portion 10, the slider 5 is stopped, and the movement to move in an axial direction of the rotating cam member 7 is converted into rotational movement by engaging the first chevron teeth 73 with the second chevron teeth 55. That is, the first rotating cam member 7 intermittently turns in a single direction.

With reference to FIG. 8, as the card 1c is released subsequently after the state in which the card 1c is pushed completely to a side of the base end portion of the concave portion 10, the card 1c is biased by the compression coil spring 8, so that the rotating cam member 7 moves to a side of the leading end portion of the concave portion 10. Then, the second inclined surface 722 of the second protrusion 72 abuts the first inclined surface 15 of the passage groove 14, so that the rotating cam member 7 intermittently further turns. It should be noted that FIG. 8 is a view illustrating a state immediately before the rotating cam member 7 intermittently further turns.

With reference to FIGS. 9, 12A and 12B, as the rotating cam member 7 rotates by 1 index, the rotating cam member 7 can move since the second protrusion 72 of narrow width faces the starting end of the passage groove 14. That is, since the card 1c is dragged by the tab piece 53, the card 1c can be ejected from the card connector 100.

Furthermore, FIG. 9 is a view illustrating a state in which the card is not inserted into the card connector, and the slider 5 is biased by the compression coil spring 8 as a biasing means to move to a side of the leading end portion of the housing 1 and to be stopped, thereby entering a standby state.

In the standby state shown in FIG. 9, the first chevron teeth 73 are biased by the compression coil spring 8, and thus are imparted with a force to move toward the second chevron teeth 55. Furthermore, in this standby state, the first chevron teeth 73 are slightly engaged with the second chevron teeth 55, and the rotating cam member 7 is imparted with a force to move in a single direction. However, the second protrusion 72 is regulated by the passage groove 14, so that the rotation of the rotating cam member 7 is stopped.

When the card 1c is inserted into the connector 100, an end edge of the card 1c abuts the tab piece 53 so as to move the slider 5 and the rotating cam member 7 to a side of the base end portion. The rotation of the rotating cam member 7 is stopped also in this moving process, similarly to the above-mentioned standby state.

With reference to FIGS. 13A and 13B, as the card 1c is inserted completely into a side of the base end portion of the concave portion 10, the slider 5 is stopped, and the movement to move in an axial direction of the rotating cam member 7 is converted into the rotational movement by engaging the first chevron teeth 73 with the second chevron teeth 55. That is, the rotating cam member 7 intermittently turns in a single direction.

Subsequently, as the card 1c is released after the state in which the card 1c is pushed completely to a side of the base end portion of the concave portion 10, the second inclined surface 712 of the first protrusion 71 abuts the first inclined surface 15, and the rotating cam member 7 intermittently further turns, thereby entering the locked state shown in FIGS. 6, 10A and 10B.

Thus, the connector 100 according to the first embodiment of the present invention realizes a push-push type card connector since the connector 100 is locked when the card is pushed into the connector, and then released and ejected from the connector when the card is pushed again.

Furthermore, in relation to the housing 1, the connector 100 according to the first embodiment of the present invention is not provided with a cavity which is formed from a broad thickness direction such as the housing in Japanese Laid-Open Application Publication No. 2000-195587. The housing 1 according to the present invention is mainly formed with a pair of molds facing both surfaces thereof. Accordingly, this can contribute to a reduction in manufacturing cost of the housing.

Furthermore, the connector 100 according to the first embodiment of the present invention can assemble the housing 1, the rotating cam member 7, and the slider 5 so as to be stacked, thereby enabling a card connector with easy assembling to be provided.

Next, a configuration of a connector according to a second embodiment of the present invention will be explained. It should be noted that, in the following, description, since structures with the same reference numerals used in the first embodiment function identically, descriptions thereof may be omitted.

Figure 14:
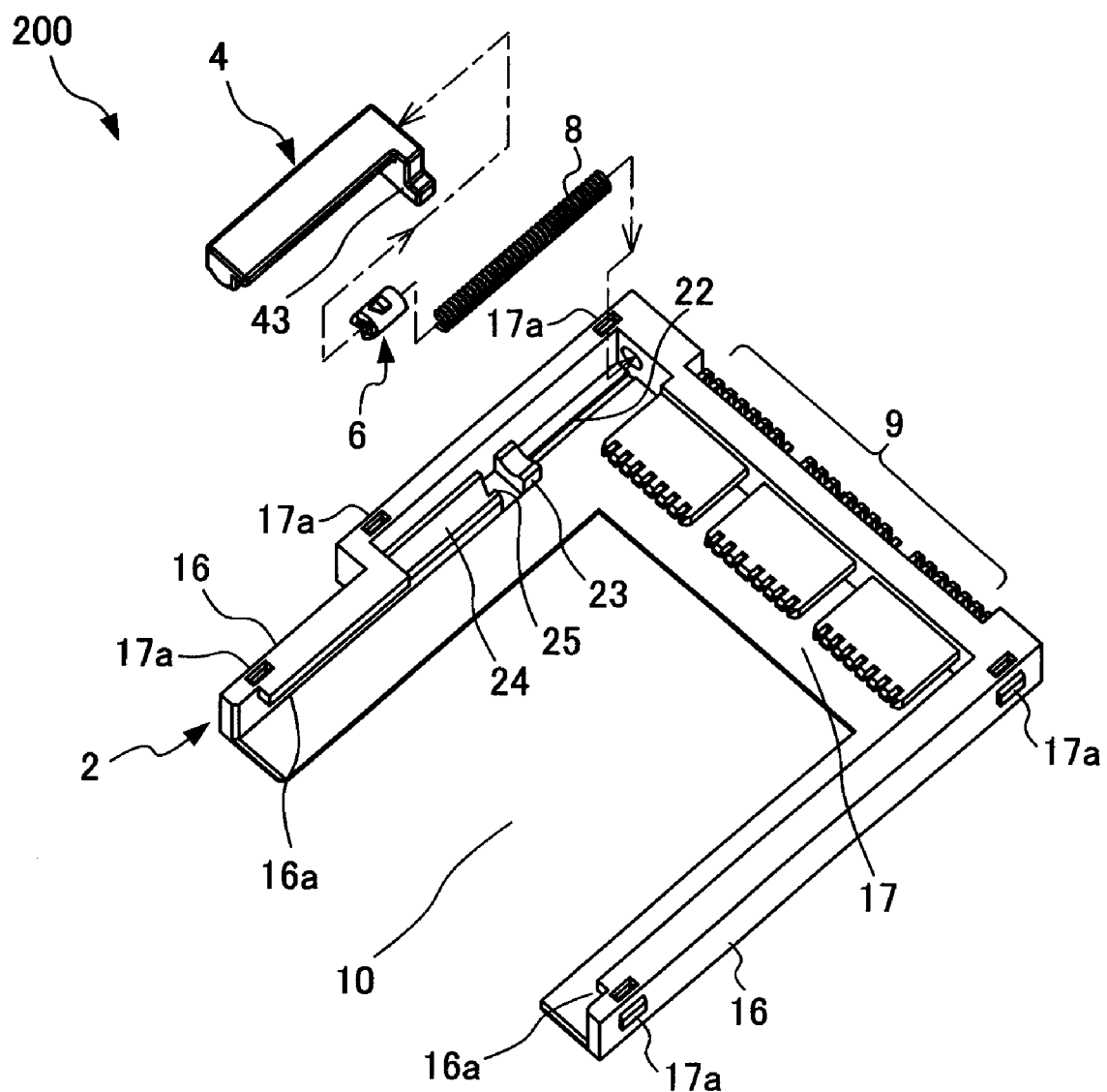
FIG. 14 is a perspective exploded view illustrating a second embodiment of a card connector according to the present invention.
Figure 15:
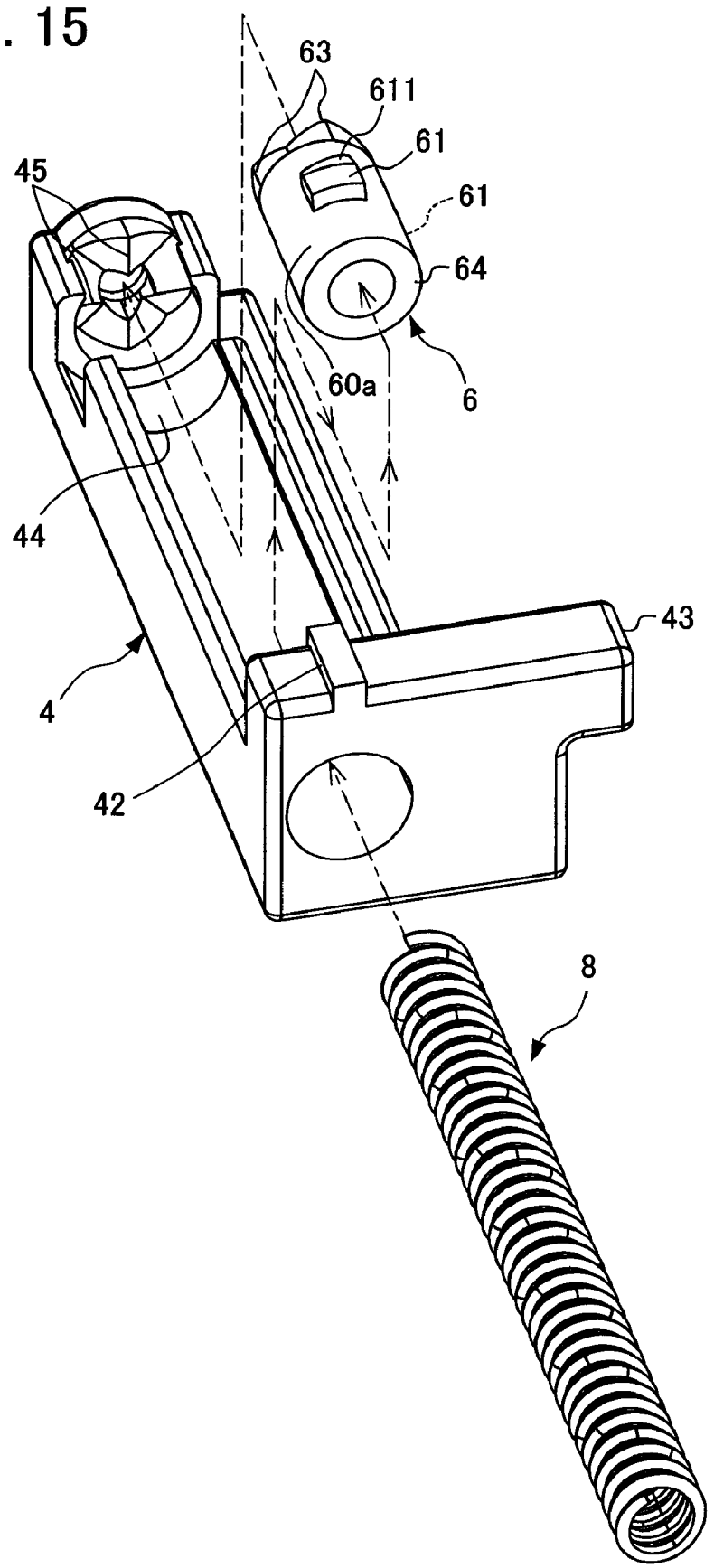
FIG. 15 is a perspective exploded view illustrating a main section of a card connector according to the second embodiment.

FIG. 14 is a perspective exploded view illustrating a second embodiment of a connector according to the present invention and illustrates a state in which a cover is removed. FIG. 15 is a perspective exploded view illustrating a main section of a connector according to the second embodiment which is configured with a slider, rotating cam member, and a compression coil spring.

With reference to FIG. 14 or 15, a connector 200 according to the second embodiment includes a housing 2 of a flat plate shape, a cover 3 (see FIG. 1 or 2), and a slider 4 of a trough shape. The housing 2 is provided with a concave portion 10 to which a card 1c is inserted. The slider 4 is disposed at one side of the concave portion 10 of the housing 2. In addition, the slider 4 is allowed to move only back and forth in parallel with an insertion direction of the card 1c.

Furthermore, with reference to FIG. 14 or 15, the connector 200 is provided with a rotating cam member 6 and a compressing coil spring (a biasing means) 8. The rotating cam member 6 is rotatable while being retained in the slider 4 and slightly moving in an axial direction. The compressing coil spring 8 biases the rotating cam member 6 in a direction in which the card 1c is ejected (see FIG. 1).

With reference to FIG. 14 or 15, the housing 2 includes a linear groove 22. The linear groove 22 guides a projection 42, which is disposed along a longitudinal direction of the slider 4.

With reference to FIG. 14 or 15 again, the slider 4 includes a tab piece 43. The tab piece 43 protrudes in a direction substantially orthogonal to the longitudinal direction of the slider 4, and an end edge of the card 1c can abut the tab piece 43.

With reference to FIG. 14 or 15, the rotating cam member 6 includes a pair of protrusions 61 and 61, a plurality of ratchet shaped first chevron teeth 63, and an edge face 64. The pair of protrusions 61 and 61 protrudes in an opposite direction than to an outer circumference of a cylindrical shaft portion 60a. The first chevron teeth 63 are provided at one end of the shaft portion 60a and protrude in an axial direction. The end surface 64 is provided at the other end of the shaft portion 60a and one end of the compressing coil spring 8 abuts the edge face 64.

With reference to FIG. 14 or 15 again, the second housing 2 is provided with a minor arc groove 23, an arc groove 24, and a pair of first inclined surfaces 25 and 25 (not shown). The minor arc groove 23 receives an outer circumference of the shaft portion 60a. The arc groove 24 shares a central axis with the minor arc groove 23, so that only an outer circumference of the shaft portion 60a other than the pair of protrusions 61 and 61 can pass therethrough. The pair of the first inclined surfaces 25 and 25 is formed at both sides of the starting end of the passage groove 14 at predetermined angles so that a plane including the central axis of the rotating cam member intersects a plane of each of the first inclined surfaces at the same angle.

With reference to FIG. 5 again, the slider 4 is provided with a bearing portion 44 and a plurality of ratchet shaped second chevron teeth 45. The second bearing portion 44 is open in a direction of an outer circumference and retains an outer circumference of the shaft portion 60a. The second chevron teeth 45 engage with the first chevron teeth 63 so as to intermittently rotate the rotating cam member 6 in a single direction.

With reference to FIG. 15, on the protrusions 61, second inclined surfaces 611 are respectively provided in the direction in which the first chevron teeth 63 protrude (see FIG. 6 or 9). The second inclined surface 611 abuts the pair of the first inclined surface 25 (not shown) so as to intermittently rotate the rotating cam member 6 in a single direction. Then, the housing 2 is mainly formed by a pair of molds facing both surfaces thereof.

With reference to FIG. 14 or 15, the bearing portion 44 is open in a direction of an outer circumference to be slightly larger than the diameter of the shaft portion 60a. The shaft portion 60a can be retained by inserting the shaft portion 60a into the bearing portion 54 from a direction of the outer circumference. The minor arc groove 23 is open to be smaller than a diameter of the shaft portion 60a and can partially support an outer circumference of the shaft portion 60a without abutting the slider 4.

With reference to FIG. 15, the slider 4 and the rotating cam member 6 configure an intermittent moving device. The bearing portion 44 and a plurality of the second chevron teeth 45 are disposed so as to face each other, sharing a central axis. Therefore, as the first chevron teeth 63 moves back and forth in regard to the second chevron teeth 45, the rotating cam member 6 can be rotated intermittently in a single direction. Furthermore, the slider 4 and the rotating cam member 6 configure a three-dimensional cam device in which the rotating cam member 6 rotates while moving back and forth.

Figure 16A:
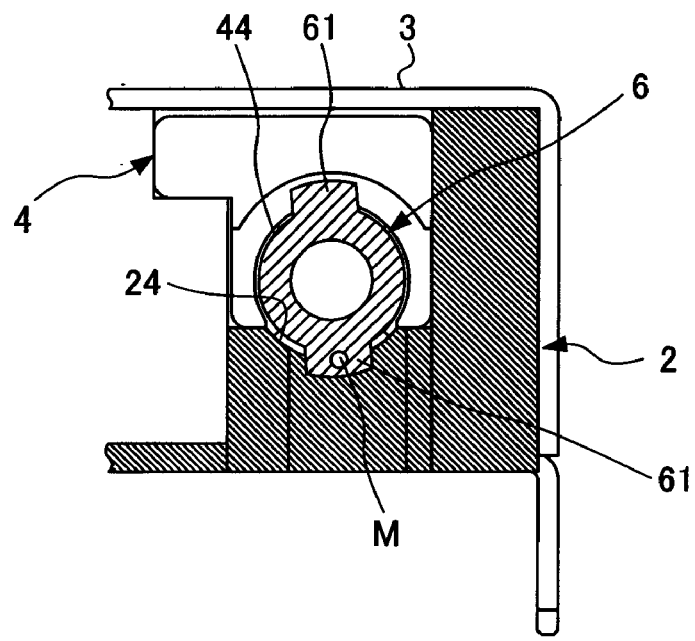
FIG. 16A is a cross-sectional view corresponding to FIG. 10A.
Figure 16B:
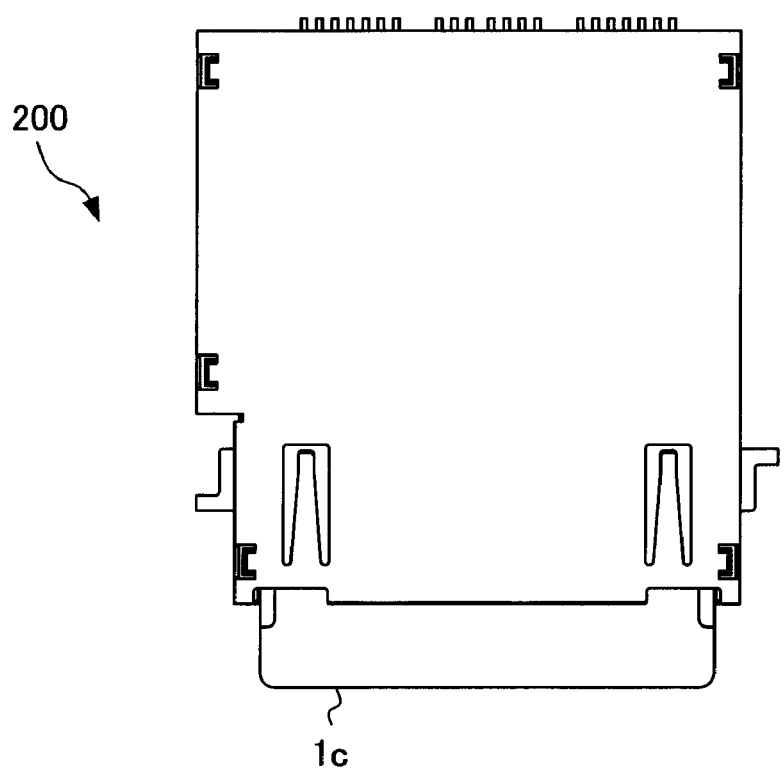
FIG. 16B is a plan view illustrating a state of a card connector when in the state of FIG. 16A.
Figure 17A:
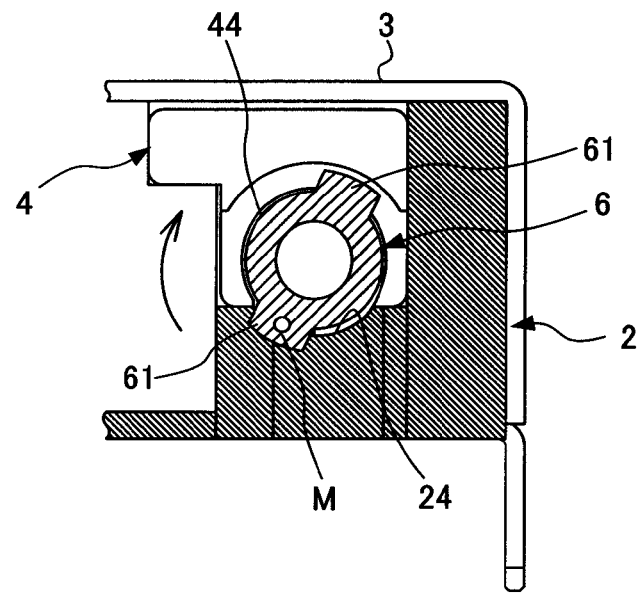
FIG. 17A is a cross-sectional view corresponding to FIG. 11A.
Figure 17B:
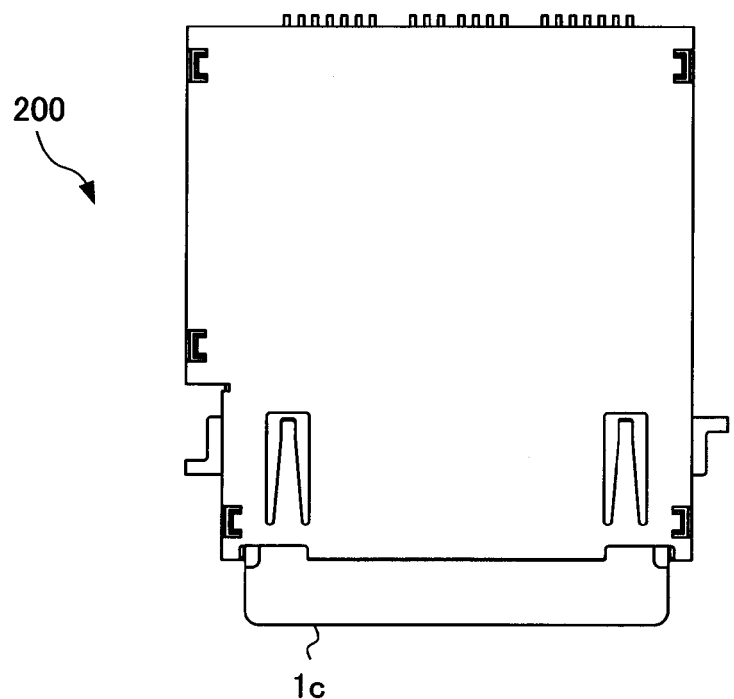
FIG. 17B is a plan view illustrating a state of a card connector when in the state of FIG. 17A.
Figure 18A:
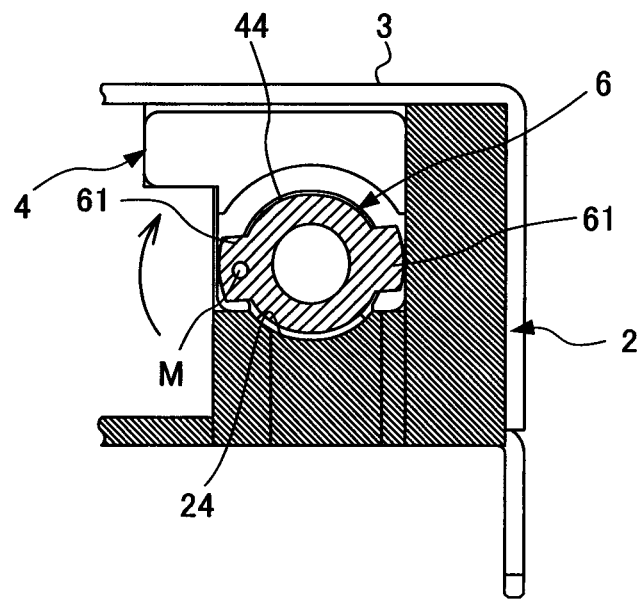
FIG. 18A is a cross-sectional view corresponding to FIG. 12A.
Figure 18B:
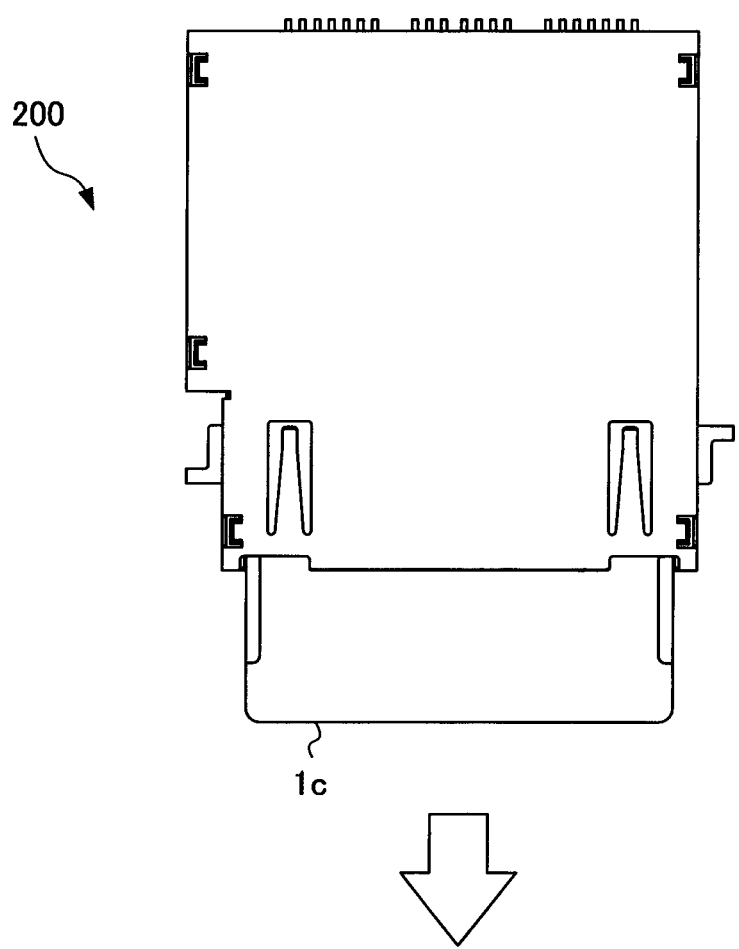
FIG. 18B is a plan view illustrating a state of a card connector when in the state of FIG. 18A.

FIGS. 16A and 16B are views illustrating a state in which a card is inserted and locked to a connector according to the second embodiment. FIG. 16A is a cross-sectional view corresponding to FIG. 10A, and FIG. 16B is a plan view illustrating a state of a card connector when in the state of FIG. 16A. FIGS. 17A and 17B are views illustrating a state change from FIG. 16. FIG. 17A is a cross-sectional view corresponding to FIG. 11A, and FIG. 17B is a plan view illustrating a state of a card connector when in the state of FIG. 17A. FIGS. 18A and 18B are views illustrating a state change from FIG. 17. FIG. 18A is a cross-sectional view corresponding to FIG. 12A, and FIG. 18B is a plan view illustrating a state of a card connector when in the state of FIG. 18A.

Figure 19A:
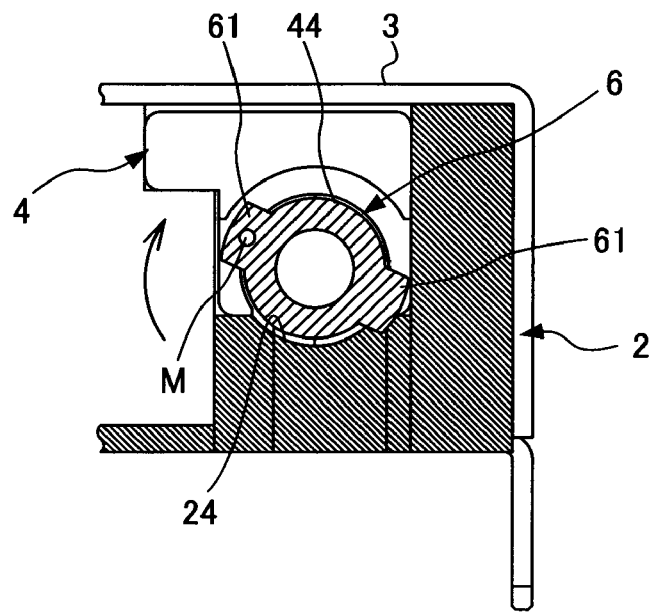
FIG. 19A is a view of a state change from FIG. 18A.
Figure 19B:
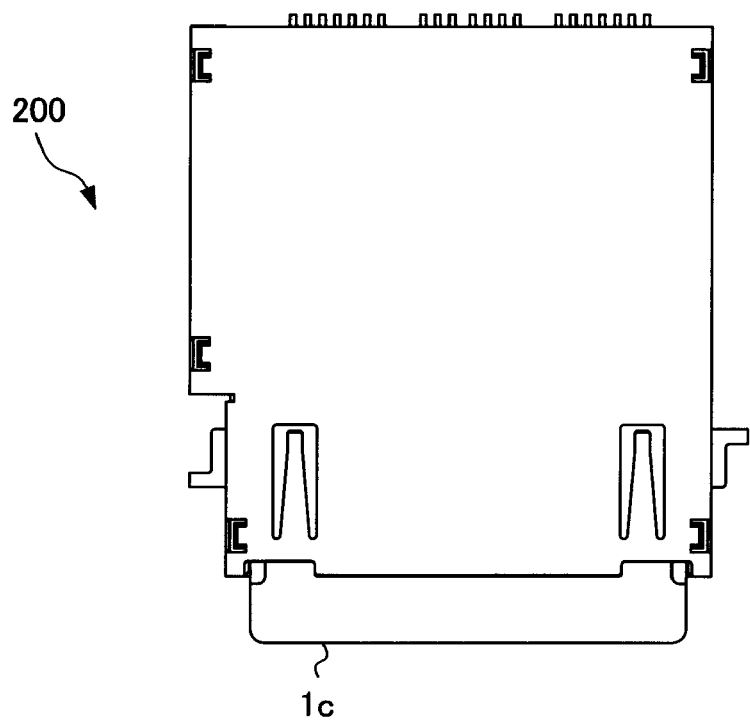
FIG. 19B is a plan view illustrating a state of a card connector when in the state of FIG. 19A.
Figure 19B:
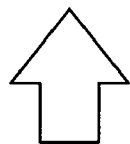

FIGS. 19A and 19B are views illustrating a state in which a card is inserted and pushed completely into a connector according to the second embodiment. FIG. 19A is a view illustrating a state change from FIG. 18A, and FIG. 19B is a plan view illustrating a state of a card connector when in the state of FIG. 19A.

With reference to FIGS. 16A and 16B through FIGS. 19A and 19B, operations of the connector 200 according to a second embodiment of the present invention are explained while citing FIGS. 6 to 9.

With reference to FIGS. 6, 16A and 16B, the first chevron teeth 63 are biased by the compression coil spring 8 and thus are imparted a force to move toward the second chevron teeth 45. In the state shown in FIG. 6, although the first chevron teeth 73 are slightly engaged with the second chevron teeth 45, the rotation of the rotating cam member 6 is stopped.

With reference to FIGS. 16A and 16B, the card 1c enters a state of being inserted into the connector 200. By being biased by the compression coil spring 8, the rotating cam member 6 is imparted a force to move toward a side of the leading end portion of the housing 2. However, since the protrusion 61 faces the starting end of the arc groove 24, it is difficult to move the rotating cam member 6. That is, the slider 4 is locked relative to the housing 2 (in a locked state).

With reference to FIGS. 7, 17A and 17B, subsequent to the locked state, as the card 1c is pushed completely into a side of the base end portion of the concave portion 10, the slider 4 is stopped, and the movement to move toward an axial direction of the rotating cam member 6 is converted into rotational movement by engaging the first chevron teeth 63 with the second chevron teeth 45. That is, the rotating cam member 6 intermittently turns in a single direction.

Next, as the card 1c is released from the state in which the card 1c is pushed completely to a side of the base end portion of the concave portion 10, the card 1c is biased by the compression coil spring 8, so that the rotating cam member 6 moves to a side of the leading end portion of the concave portion 10. Then, the second inclined surface 611 of the protrusion 61 abuts the first inclined surface 25 of the arc groove 24, so that the rotating cam member 6 intermittently further turns.

With reference to FIGS. 18A and 18B, as the rotating cam member 6 rotates by 1 index, the rotating cam member 6 can move since an outer circumference of the shaft portion 60a excluding the pair of protrusions 61 and 61 faces the starting end of the arc groove 24. That is, since the card 1c is dragged by the tab piece 43, the card 1c can be ejected from the card connector 200.

With reference to FIGS. 19A and 19B, as the card 1c is pushed completely into a side of the base end portion of the concave portion 10, the slider 4 is stopped, and the movement in an axial direction of the rotating cam member 6 is converted into rotational movement by engaging the first chevron teeth 63 with the second chevron teeth 45. That is, the rotating cam member 6 intermittently turns in a single direction.

Next, as the card 1c is released from the state in which the card 1c is pushed completely to a side of the base end portion of the concave portion 10, the second inclined surface 611 of the protrusion 61 abuts the first inclined surface 25, and the rotating cam member 6 intermittently turns more, thereby entering the locked state shown in FIG. 16.

Thus, the connector 200 according to the second embodiment of the present invention realizes a push-push type card connector since the connector 200 is locked when the card is pushed into the connector and then released and ejected from the connector when the card is pushed again.

Furthermore, in relation to the housing 2, the connector 200 according to the second embodiment of the present invention is not provided with a cavity formed from a broad thickness direction such as the housing according to Japanese Laid-Open Application Publication No. 2000-195587. The housing 2 according to the present invention is mainly formed with a pair of molds facing both surfaces thereof. Accordingly, this can contribute to a reduction in manufacturing cost of the housing 2.

Furthermore, the connector 200 according to the second embodiment of the present invention can assemble the housing 2, the rotating cam member 6, and the second slider 4 so as to be stacked, and thus a card connector with easy assembling can be provided.

What is claimed is:

1. A card connector comprising:
 a housing of a flat plate shape that is provided with a concave portion into which a card is inserted;
 a cover that is provided with a flat surface, covering the concave portion of the housing;
 a slider of a trough shape that is disposed at one wing of the concave portion of the housing and is allowed to move only back and forth substantially in parallel with an insertion direction of the card;
 a rotating cam member that is rotatable while being retained in the slider and slightly moving in an axial direction; and
 a biasing means for biasing the rotating cam member in a direction that the card is ejected with a force, wherein:
 the housing includes a first linear groove and a second linear groove that guide a first projection and a second projection that are disposed so as to face each other along a longitudinal direction of the slider,
 the slider includes a tab piece that protrudes in a direction substantially perpendicular to the longitudinal direction of the slider and can be abutted by an end edge of the card,
 the rotating cam member includes:
 a plurality of protrusions that protrudes radially to an outer circumference of a cylindrical shaft portion, and have first broad protrusions and second narrow protrusions alternately;
 a plurality of ratchet shaped first chevron teeth that is provided at one end of the shaft portion and protrudes in an axial direction; and
 an edge face that is provided at the other end of the shaft portion and is abutted by one end of the biasing means,
 the housing includes:
 a minor arc groove that receives an outer circumference of the shaft portion;
 a passage groove that communicates with the first linear groove that guides the first projection so that only one of the second protrusion can pass therethrough; and
 a pair of first inclined surfaces that is formed in both sides of a starting edge of the passage groove at predetermined angles so that a plane including a central axis of the rotating cam member intersects a plane of each of the first inclined surfaces at the same angle, and
 the slider includes:
 a bearing portion that is open in an outer circumferential direction and retains an outer circumference of the shaft portion; and
 a plurality of ratchet shaped second chevron teeth that engages with the first chevron teeth so as to rotate the rotating cam member intermittently in a single direction,
 the first protrusion and the second protrusion have, in a direction in which the first chevron teeth protrude, a second inclined surface that abuts a pair of the first inclined surfaces so as to rotate the rotating cam member intermittently in a single direction, and
 the housing is mainly formed with a pair of molds facing both surfaces thereof.

2. A card connector comprising:
 a housing of a flat plate shape that is provided with a concave portion into which a card is inserted;
 a cover that is provided with a flat surface, covering the concave portion of the housing;
 a slider of a trough-shape that is disposed at one wing of the concave portion of the housing and is allowed to move only back and forth substantially in parallel with an insertion direction of the card;
 a rotating cam member that is rotatable while being retained in the slider and slightly moving in an axial direction; and
 a biasing means for biasing the rotating cam member in a direction that the card is ejected with a force, wherein:
 the housing includes a linear groove that guides projections disposed along a longitudinal direction of the slider,
 the slider includes a tab piece that protrudes in a direction substantially perpendicular to the longitudinal direction of the slider and can be abutted by an end edge of the card,
 the rotating cam member includes:
 a pair of protrusions that protrudes in an opposite direction than to an outer circumference of a shaft portion of cylindrical shape;
 a plurality of ratchet shaped first chevron teeth that is provided at one end of the shaft portion and protrudes in an axial direction; and an edge face that is provided at the other end of the shaft portion and is abutted by one end of the biasing means the housing includes:

a minor arc groove that receives an outer circumference of the shaft portion;

an arc groove that shares a central axis with the minor arc groove so that only an outer circumference of the shaft portion excluding the pair of protrusions can pass therethrough;

a pair of first inclined surfaces that is formed in both sides of a starting end of the arc groove at predetermined angles so that a plane including the central axis intersects a plane of each of the first inclined surfaces at the same angle, and the slider includes:

a bearing portion that is open in an outer circumferential direction and retains an outer circumference of the shaft portion; and a plurality of ratchet shaped second chevron teeth that engages with the first chevron teeth so as to rotate the rotating cam member intermittently in a single direction, the protrusion has, in a direction that the first chevron teeth protrudes, a second inclined surface that abuts a pair of the first inclined surfaces so as to rotate the rotating cam member intermittently in a single direction, and the housing is mainly formed with a pair of molds facing both surfaces thereof.

* * * * *